United States Patent
Nashiki et al.

(10) Patent No.: US 9,745,655 B2
(45) Date of Patent: Aug. 29, 2017

(54) SPUTTERING DEVICE AND MAINTENANCE METHOD FOR SPUTTERING DEVICE

(71) Applicant: NITTO DENKO CORPORATION, Ibaraki-shi, Osaka (JP)

(72) Inventors: Tomotake Nashiki, Ibaraki (JP); Akira Hamada, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/026,202

(22) PCT Filed: Oct. 10, 2014

(86) PCT No.: PCT/JP2014/077192
§ 371 (c)(1),
(2) Date: Mar. 30, 2016

(87) PCT Pub. No.: WO2015/053392
PCT Pub. Date: Apr. 16, 2015

(65) Prior Publication Data
US 2016/0237550 A1 Aug. 18, 2016

(30) Foreign Application Priority Data
Oct. 10, 2013 (JP) .................................. 2013-212629

(51) Int. Cl.
C23C 14/34 (2006.01)
C23C 14/56 (2006.01)

(52) U.S. Cl.
CPC ...... *C23C 14/3407* (2013.01); *C23C 14/3464* (2013.01); *C23C 14/562* (2013.01)

(58) Field of Classification Search
CPC ............ C23C 14/3407; C23C 14/3464; C23C 14/562; H01J 37/3435
(Continued)

(56) References Cited

U.S. PATENT DOCUMENTS

2010/0101945 A1  4/2010 Ohmi et al.
2011/0139072 A1  6/2011 Tamagaki et al.

FOREIGN PATENT DOCUMENTS

JP     10-36967 A    2/1998
JP     10-212578 A   8/1998
(Continued)

OTHER PUBLICATIONS

International Search Report dated Jan. 6, 2015, issued in counterpart International Application No. PCT/JP2014/077192 (2 pages).

*Primary Examiner* — Rodney McDonald
(74) *Attorney, Agent, or Firm* — Westerman, Hattori, Daniels & Adrian, LLP

(57) ABSTRACT

A maintenance method for a sputtering device includes the steps of: moving a cathode carriage to take a plurality of targets and a plurality of cathodes out of a vacuum chamber; operating a plurality of cathode rotating apparatuses to rotate the targets and the cathodes so as to cause the targets to face upwards; operating a plurality of cathode sliding apparatuses to move the targets and the cathodes located in places at high height to places at low height; removing the targets from the cathodes to attach a plurality of new targets to the cathodes; returning the targets and the cathodes to an original height thereof; returning the targets and the cathodes to original rotation angles; and putting the targets and the cathodes back into the vacuum chamber.

5 Claims, 4 Drawing Sheets

Front view          Side view

(58) Field of Classification Search
USPC .......... 204/192.12, 298.24, 298.25; 118/718, 118/719
See application file for complete search history.

(56) References Cited

FOREIGN PATENT DOCUMENTS

| | | |
|---|---|---|
| JP | 2002-60936 A | 2/2002 |
| JP | 2006-322055 A | 11/2006 |
| JP | 2008-31492 A | 2/2008 |
| JP | 2010-53382 A | 3/2010 |
| JP | 2012-136724 A | 7/2012 |
| TW | I299365 B | 8/2008 |
| TW | I386507 B | 2/2013 |
| TW | I400347 B | 7/2013 |
| TW | I410511 B | 10/2013 |
| WO | 2012/053171 A1 | 4/2012 |

Front view

Side view

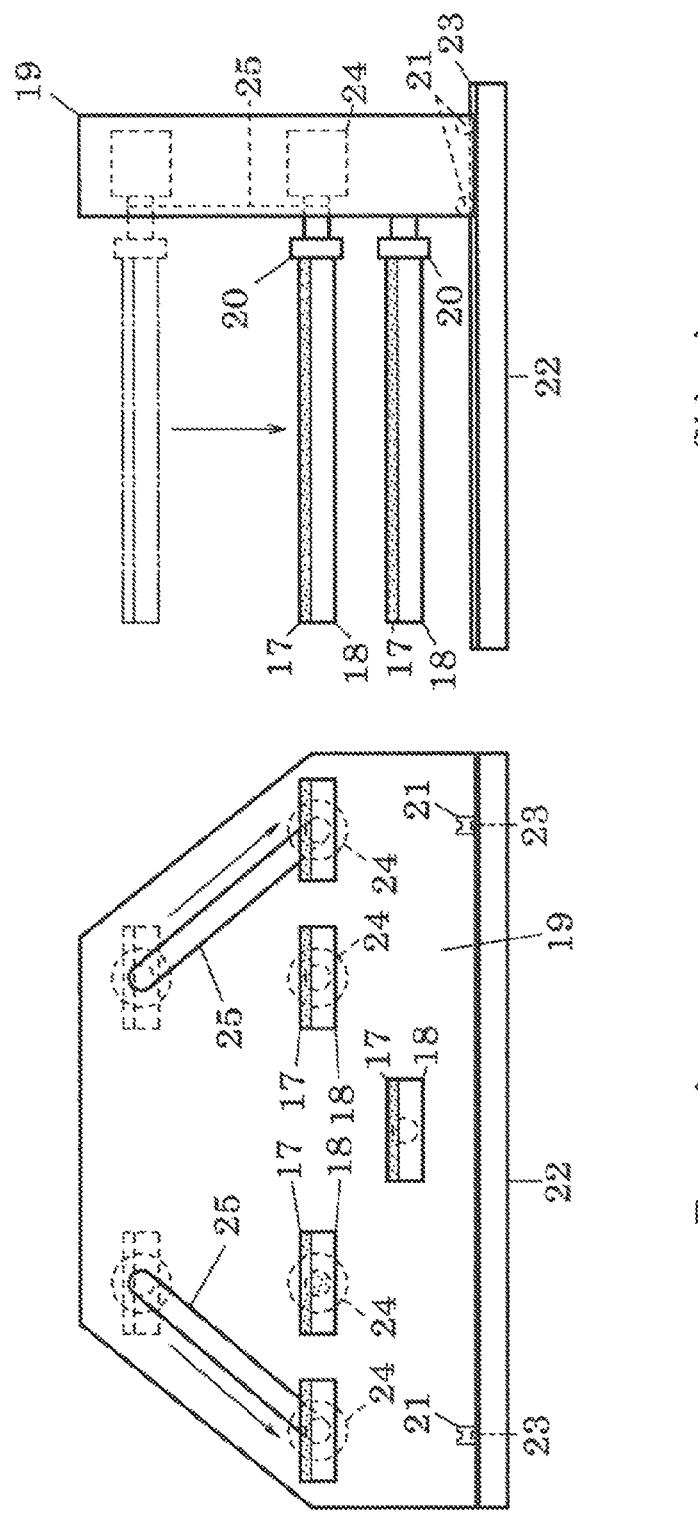

SPUTTERING DEVICE AND MAINTENANCE METHOD FOR SPUTTERING DEVICE

BACKGROUND OF THE INVENTION

Field of the Invention

The present invention relates to a sputtering device including a plurality of targets and a plurality of cathodes that forms a thin layer on a surface of a long film substrate and a maintenance method for such a sputtering device.

Description of the Related Art

A sputtering method is widely used as a method for forming a thin layer on a surface of a long film substrate. In a sputtering device having a long film substrate, a layer forming roll and a plurality of targets are placed oppositely at predetermined intervals. A layer forming roll wound around by a long film substrate in a sputtering gas such as a low-pressure argon gas is referred to as an anode potential and a target is referred to as a cathode potential. A voltage is applied between the layer forming roll and the target to create a plasma in the sputtering gas between the layer forming roll and the target. Sputtering gas ions in plasma collide with the target to knock out components of the target. The knocked out components of the target deposit on the long film substrate to form a thin layer.

In the case of a long film substrate, it is impossible to form a sputtered layer over the whole of the long film substrate at a time. Accordingly, the long film substrate delivered from a supply roll is wound around the layer forming roll (can roll) by less than one round, and the layer forming roll is rotated to cause the long film substrate to continuously run. A thin layer is deposited on a portion of the long film substrate facing to the target. The long film substrate after completion of thin layer deposition is wound to a storage roll.

In general, a target is supported on a cathode by screw clamp. The target and the cathode are in identical potential. Since a target and a cathode are a pair (set), it is referred to as "a target and a cathode". Screws are removed to separate the cathode from the target when replacing the target. As the thin film formation is promoted, the target exhausts. When the target exhausts in a predetermined amount, a new target has to be replaced. Contaminants, such as components of the target adhere to a cathode. When the contamination of the cathode becomes worse, abnormal electrical discharge is generated and impurities are mixed in a thin layer. Accordingly, the cathode needs to be cleaned before the contamination becomes worse. It is also preferable to separate the target and the cathode when cleaning the cathode.

In the case of a small-size sputtering apparatus, targets are easily replaceable by human power. In addition, the cleaning of cathodes is easy. However, in the current long film substrate included in the sputtering apparatus, the long film substrate has a width of about 1.6 m, so that the weight of targets and cathodes is some hundred Kgs. Since it is possible to handle the targets and the cathodes by human power, it is needed to use a crane or a lift when replacing the targets.

A plurality of targets are opposed to the layer forming roll at small intervals. This makes it difficult to remove the screw and replace the targets at a position where the targets are placed opposite to the layer forming roll. In a conventional maintenance method, first, a plurality of targets and a plurality of cathodes are placed on a cart for maintenance to be removed from a vacuum chamber. Next, a locking screw of each of old targets is taken off on a cart for maintenance to remove the old targets. Contamination of the cathodes is cleaned. And then new targets are screwed. Subsequently, the targets and the cathodes return to the predetermined position in the vacuum chamber by use of the cart for maintenance to be fixed.

As well as the conventional maintenance method has poor work efficiency, it is dangerous to transfer the big and heavy targets and cathodes to the cart for maintenance. Specifically, in a sputtering device equipped with a large number of targets and cathodes so as to surround a layer forming roll, it takes an extremely long time to carry out maintenance, resulting in a significant decrease in operation rates of the sputtering apparatus when the large number of targets and cathodes are taken off, old targets are removed, the cathodes are cleaned to attach new targets and work to replace the targets and the cathodes one by one.

Various measures have been taken related to the above-mentioned problem. For instance, Japanese Unexamined Patent Application Publication No. JP 10-036967 A and Japanese Unexamined Patent Application Publication No. JP 2002-060936 A disclose that a part of a wall of a vacuum chamber is an openable wall which is openable/closable and a plurality of targets and a plurality of cathodes are fixed to the openable wall. When the openable wall is moved in parallel with a central axis of the layer forming roll, the targets and the cathodes are removed from the vacuum chamber while the targets and the cathodes are fixed to the openable wall. And the targets are replaced to clean contamination of the cathodes. Subsequently, the openable wall is caused to move to the original position and the targets and the cathodes are caused to return to a predetermined position respectively (a position where the layer forming roll is surrounded) in the vacuum chamber. According to this maintenance method, since there is no need to transfer the targets and the cathodes to the cart for maintenance, work efficiency to take off the targets and the cathodes and return to the original position is excellent. In addition, there is a slight danger of work.

Alternatively, Japanese Unexamined Patent Application Publication No. JP 2006-322055 A discloses that a part of a wall of a vacuum chamber is an openeable wall that is openeable/closable and a plurality of targets and a plurality of cathodes are fixed to the openable wall via a hinge. When the openeable wall is caused to move in parallel with a central axis of a layer forming roll, the targets and the cathodes are removed from the vacuum chamber, keeping being fixed to the openable wall. Next, when the targets and the cathodes are opened in a direction perpendicular to the openeable wall by use of the hinge, a work area is expanded. And the targets are replaced to clean contamination of the cathodes. Subsequently, the openable wall is caused to move to the original position to return each of the targets and the cathodes to a predetermined position (a position where the layer forming roll is surrounded) in the vacuum chamber after the targets and the cathodes are caused to return to original angles thereof. According to this maintenance method, since there is no need to transfer the targets and the cathodes to a cart for maintenance, the work area is expanded. This enables to simultaneously replace a plurality of targets and clean a plurality of cathodes by two persons or more.

PRIOR ART DOCUMENTS

Patent Documents

Patent document 1: JP 10-036967 A
Patent document 2: JP 2002-060936 A
Patent document 3: JP 2006-322055 A

SUMMARY OF THE INVENTION

In maintenance methods stated in JP 10-036967 A and JP 2002-060936 A, it is not needed to transfer targets and cathodes to a cart for maintenance. Further, it is possible to take out all targets and all cathodes and put all of the targets and the cathodes back. Therefore, the aforementioned maintenance methods are more efficient than conventional maintenance methods. Furthermore, there is no risk when transferring the targets and the cathodes to a cart for maintenance. The taken out targets and cathodes remain positioned so as to surround a layer forming roll. As a result, a worker needs to enter space where the layer forming roll was located by mounting a stepladder to replace the targets and clean the cathodes. Since it is difficult for two or more workers to enter the space where the layer forming roll was located, it is difficult for the workers to work simultaneously. Consequently, while the aforementioned methods are more efficient than the conventional methods, it is difficult to significantly reduce operation time. Working while mounting the stepladder is dangerous.

In maintenance methods stated in JP 10-036967 A and JP 2002-060936 A, since the taken out targets and cathodes remain positioned so as to surround the layer forming roll, some of the targets are laterally-facing and some of the targets are downward facing. In the case where the targets are laterally-facing or the targets are downward facing, when screws for attaching the targets to the cathodes are removed, the targets fall, which is extremely dangerous. Accordingly, preparation work to attach a fall prevention jig for targets is needed before removing the screws. This results in decrease in efficiency of maintenance work.

In the maintenance method stated in JP 2006-322055 A, when a plurality of targets and a plurality of cathodes are opened to a direction perpendicular to openable walls, work area becomes larger. The large work area makes it possible to replace a plurality of targets and clean a plurality of cathodes by two persons or more at the same time. Accordingly, this maintenance method is more efficient than the method disclosed in JP 10-036967 A and the method disclosed in JP 2002-060936 A, resulting in reduction in time that has taken maintenance work. Even when the targets and the cathodes are open to the direction perpendicular to the openable walls, the height of each of the targets and the cathodes located at high height is not changed. As a result, working while mounting a stepladder needs to be performed. Accordingly, working while mounting the stepladder is dangerous.

In the method disclosed in JP 2006-322055 A, even when a plurality of targets and a plurality of cathodes are open to a direction perpendicular to openable walls by use of a hinge, the up and down orientation of the targets toward the cathodes is not changed. That is, when the targets before being opened are in a lateral direction (downward direction), the direction of the targets after being opened is also in a lateral direction (downward direction). The targets fall when removing screws that attach the targets to the cathodes, which is extremely dangerous. Accordingly, preparation work to install a fall prevention jig for targets is necessary before removing the screws. As a result, the efficiency of replacement of the targets is not so different from the efficiency of the method disclosed in JP 10-036967 A and the method disclosed in JP 2002-060936 A.

In addition to taking out and returning all targets and cathodes all at once in maintenance of targets and cathodes (replacement of targets and cleaning of cathodes), the present invention has the following objects:

(1) It is an object of the present invention to simultaneously carry out maintenance work by two persons or more.
(2) It is another object of the present invention to skip work at height (stepladder).
(3) It is still another object of the present invention to replace all targets in a state of an upward direction to prevent the targets from falling. The object of simultaneous working by two persons or more is to reduce work time. The object of skipping the stepladder work is to prevent danger and reduce work time. The object of replacing all targets in a state that all of the targets are in an upward direction is to prevent danger and reduce work time. According to the present invention, it is possible to reduce maintenance time and increase production quantity as well as reduction in costs by increasing an operation rate of a high-priced sputtering device.

The summary of the present invention is described as below.

In a first preferred aspect of the present invention, there is provided a sputtering device which includes: a vacuum chamber; a layer forming roll included in the vacuum chamber; a plurality of targets opposing to the layer forming roll; a plurality of cathodes for supporting the plurality of targets; a cathode carriage for supporting the plurality of targets and the plurality of cathodes; a plurality of cathode rotating apparatuses provided on the cathode carriage, the plurality of cathode rotating apparatuses being configured to rotationally support the targets and the cathodes by use of a longitudinal direction of each of the targets as a rotational axis; a plurality of cathode sliding apparatuses provided on the cathode carriage, the plurality of cathode sliding apparatuses being configured to support the plurality of cathode rotating apparatuses so as to change height of the cathode rotating apparatuses; and guiding parts for movably supporting and guiding the cathode carriage. The guiding parts are typically rails or grooves.

In a second preferred aspect of the sputtering device of the present invention, the cathode rotating apparatuses each include an angular sensor.

In a third preferred aspect of the sputtering device of the present invention, the cathode sliding apparatuses each include a distance sensor.

In a fourth preferred aspect of the present invention, there is provided a maintenance method for a sputtering device which includes the steps of:
(a) moving a cathode carriage to take a plurality of targets and a plurality of cathodes supported by the cathode carriage out of a vacuum chamber;
(b) operating a plurality of cathode rotating apparatuses to rotate the plurality of targets and the plurality of cathodes so as to cause the targets to face upwards;
(c) operating a plurality of cathode sliding apparatuses to move the targets and the cathodes located in places at high height to places at low height;
(d) removing the targets from the cathodes to attach a plurality of new targets to the cathodes;
(e) operating the plurality of cathode sliding apparatuses to move the plurality of new targets and the cathodes to return to an original height thereof;
(f) operating the plurality of cathode rotating apparatuses to rotate the new targets and the cathodes so as to return to original rotation angles; and
(g) moving the cathode carriage in an opposite direction to put the new targets and the cathodes supported on the cathode carriage back into the vacuum chamber.

According to the sputtering device and the maintenance method for the sputtering device of the present invention, the following advantages are obtained:

(1) Since all targets and cathodes are supported by a cathode carriage, it is possible to remove and return all of the targets and cathodes all at once by moving the cathode carriage.
(2) The cathode carriage is moved to take a plurality of targets and a plurality of cathodes supported by the cathode carriage out of a vacuum chamber and a plurality of cathode sliding apparatuses are operated to move the targets and the cathodes located in places at high height to places at low height. This makes the targets and the cathodes explore in a large area, which leads to carry out maintenance work by two persons or more at the same time.
(3) It is possible to skip stepladder work by operating the plurality of cathode sliding apparatuses and moving the targets and the cathodes located in places at high height to places at low height (it is possible to work on the floor).
(4) It is possible to replace all targets in a state of facing upwards by operating a plurality of cathode rotating apparatuses to rotate the targets and the cathodes so that the targets may face upwards.
(5) It is not only possible to reduce maintenance time by compiling the aforementioned work effects but also increase production quantity by increasing an operation rate of the high-priced sputtering device to reduce costs.

BRIEF DESCRIPTION OF THE DRAWING

FIG. 4 shows a front view and a side view of a maintenance apparatus of targets and cathodes of a sputtering device of the present invention (at the time of moving the targets and the cathodes).

DESCRIPTION OF THE PREFERRED EMBODIMENTS

Figure 1:
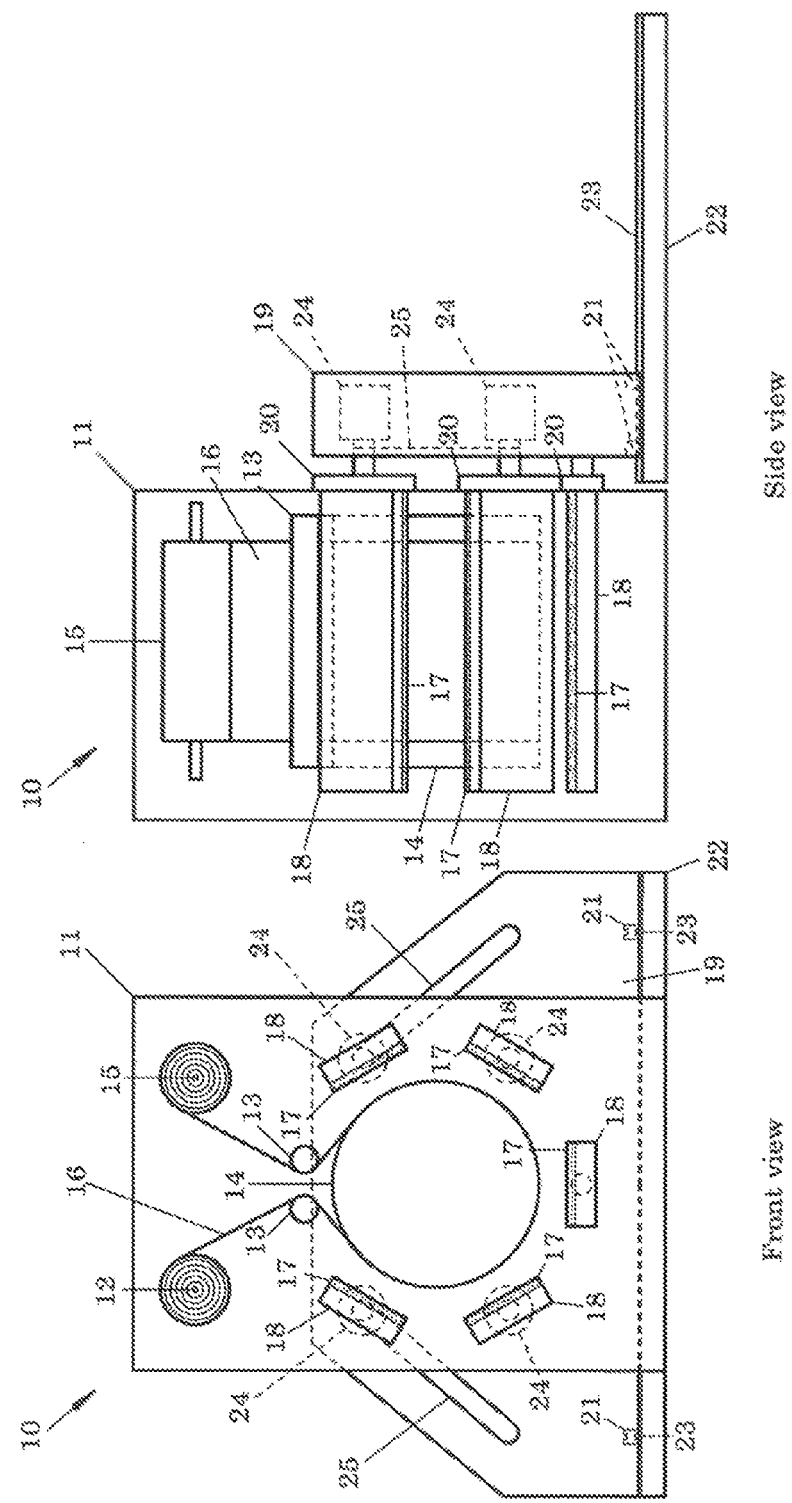
FIG. 1 shows a front view and a side view of a sputtering device of the present invention (at the time of non-maintenance)

FIG. 1 shows a front view and a side view of one example of a sputtering device 10 of the present invention at the time of sputtering (at the time of non-maintenance). In a sputtering device 10 of the present invention, a vacuum chamber 11 includes: a supply roll 12; a first guide roll 13; a layer forming roll 14; a second guide roll 13; and a storage roll 15. A long film substrate 16 is delivered from the supply roll 12 and is guided by the first guide roll 13 to be wound around the layer forming roll 14 by less than one round. And the long film substrate 16 is guided by the second guide roll 13 again to be wound up on the storage roll 15 so as to be stored. A plurality of targets 17 are being screwed and supported by a plurality of cathodes 18. The targets 17 and the cathodes 18 are identical in potential. The number of the targets 17 and the cathodes 18 are plural (five in FIG. 1). The targets 17 and the cathodes 18 are arranged at a position to surround the layer forming roll 14. Each target 17 is opposed to the layer forming roll 14 at a predetermined distance. A surface of each target 17 is in parallel with a tangent direction of the layer forming roll 14. A sputtering thin layer adheres to the long film substrate 16 that constantly travels on the layer forming roll 14 at a position opposing to the targets 17. The number of the targets 17 and the cathodes 18 is not particularly limited.

A cathode carriage 19 cantilever supports each target 17 and each cathode 18. A sealed lid 20 is provided at an end of each target 17 and each cathode 18. An outlet of each target 17 and each cathode 18 is hermetically sealed with a sealed lid 20 when storing each target 17 and each cathode 18 in the vacuum chamber 11. The cathode carriage 19 has a plurality of wheels 21. The wheels 21 are placed on a plurality of rails 23 provided on a plurality of cathode carriage bases 22. The rails 23 are arranged in a direction parallel to a central axis of the layer forming roll 14. The cathode carriage 19 moves in a direction parallel to the central axis of the layer forming roll 14 when removing the targets 17 and the cathodes 18 from the vacuum chamber 11 and putting the targets and the cathodes back into the vacuum chamber 11.

The targets 17 and the cathodes 18 except for one target 17 and one cathode 18 (the lowest target 17 and cathode 18 in FIG. 1) facing upwards at the time of sputtering are supported by a plurality of cathode rotating apparatuses 24. Since the rotation angles of the targets 17 and the cathodes 18 do not need to be changed at the time of maintenance, it is not needed for a plurality of cathode rotating apparatuses 24 to support the targets 17 and the cathodes 18. The cathode rotating apparatuses 24 are each typically a motor driving reduction gear with an angular sensor. The targets 17 and the cathodes 18 are rotated so that the targets 17 may face upwards by the cathode rotating apparatuses 24 after removing the targets 17 and the cathodes 18 from the vacuum chamber 11. After replacement of the targets 17, the targets 17 and the cathodes 18 are rotated to return to original angles (angles that the surfaces of the targets 17 are in a tangent direction of the layer forming roll 14). Since the targets 17 and the cathodes 18 need to accurately return to the original angles, an angular sensor is used.

In the targets 17 and the cathodes 18 (In FIG. 1, upper two targets and two cathodes) located in such places at high height that workers need to each mount a stepladder, the cathode rotating apparatuses 24 are supported by a plurality of cathode sliding apparatuses 25. Places at high height mean that places at height that a worker needs to mount a stepladder. For instance, it means a height having about 150 cm or higher from the floor. The cathode sliding apparatuses 25 are each a motor driving ball screw linear guide with a distance sensor. The targets 17 and the cathodes 18 placed at high height are moved to places at low height by the cathode sliding apparatuses 25 at the time of maintenance so as to enable workers to work on the floor. Places at low height mean a height at which the workers can work without a need to mount a stepladder (standing on the floor) and is, for instance, about less than 150 cm from the floor. The targets 17 and the cathodes 18 are caused to return to the original height after replacing the targets 17. Since the targets 17 and the cathodes 18 need to accurately return to the original height, a distance sensor is used.

A transparent film made of homopolymer or copolymer such as polyethylene terephthalate, polybuthylene terephthalate, poliamide, polyvinyl chloride, polycarbonate, polysthylene, polypropylene, and polyethylene can be generally used as a long film substrate 16 to be used in the sputtering device 10 of the present invention. The long film substrate 16 may be a single film or may be a laminated film.

The thickness of the long film substrate 16 is not particularly limited, but generally 6 µm to 250 µm.

In the sputtering device 10 of the present invention, a layer forming roll 14 serves as an anode potential and a plurality of targets 17 and a plurality of cathodes 18 each serve as a cathode potential in a sputtering gas such as a low-pressure argon gas to apply a voltage between the layer forming roll 14 and the targets 17. This creates a plasma of a sputtering gas between the long film substrate 16 and the targets 17. Sputtering gas ions in plasma collide with the targets 17 to knock out components of the targets 17. The knocked out components of the targets 17 deposit on the long film substrate 16 to form a thin layer.

For instance, a thin layer formed of an indium-tin-oxide (ITO) is widely used as a transparent conductive layer. The material of the targets 17 to be used for a sputtering device 10 of the present invention is, however, not particularly limited.

Figure 2:
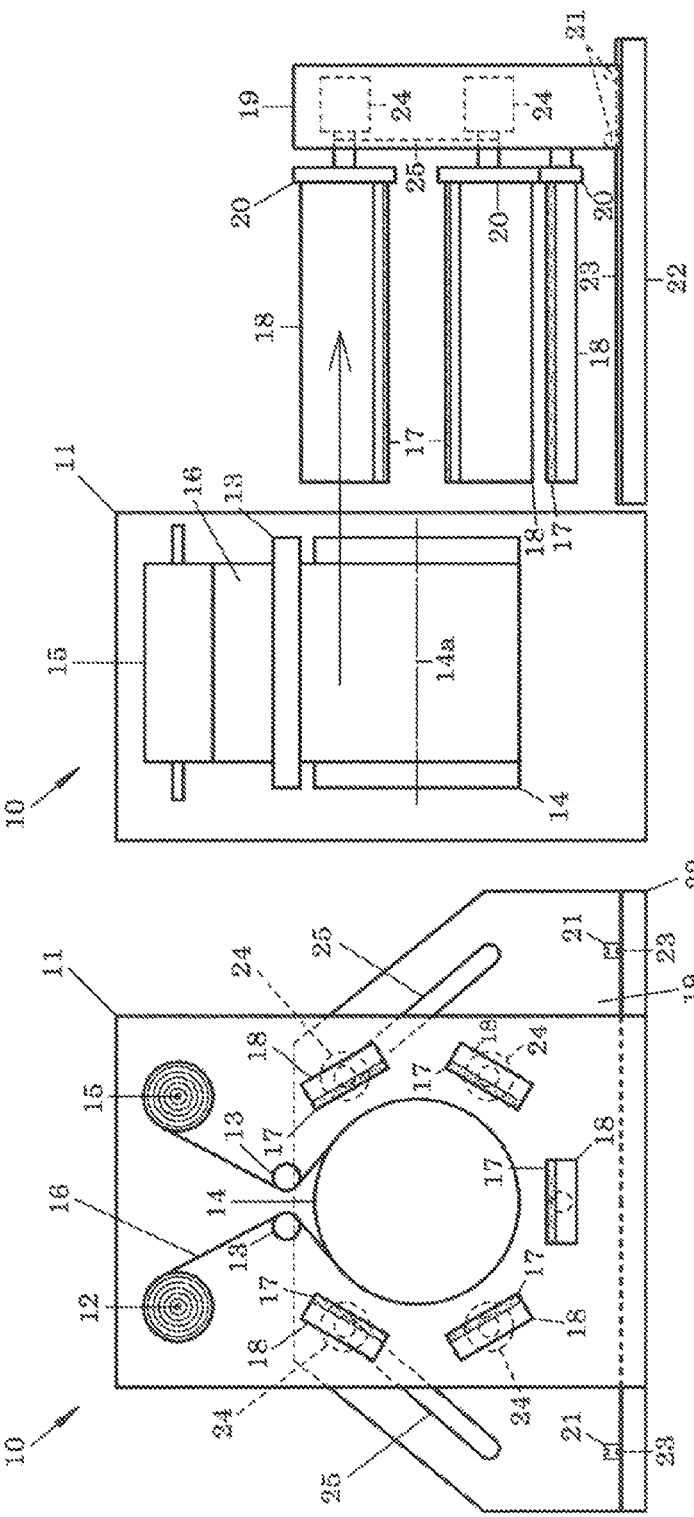
FIG. 2 shows a front view and a side view of a sputtering device of the present invention (at the time of maintenance)

FIG. 2 shows a front view and a side view at the time of taking the targets 17 and the cathodes 18 out of the vacuum chamber 11 by moving the cathode carriage 19 in a direction parallel to the central axis 14a of the layer forming roll 14 after making the vacuum chamber 11 one atmospheric pressure as a first stage of maintenance of the targets 17 and the cathodes 18. All of the targets 17 and the cathodes 18 are removed from the vacuum chamber 11 all at once by the movement of the cathode carriage 19. As a result, the work efficiency is excellent and there is a low risk. The cathode rotating apparatuses 24 and the cathode sliding apparatuses 25 are still not working and therefore, the angle and the position of each of the targets 17 and the cathodes 18 is the same as the angle and the position at the time when the targets 17 and the cathodes 18 are located around the layer forming roll 14. Accordingly, the targets 17 fall from the cathodes 18 when removing screws of the targets 17, which leads to being extremely dangerous. In the stage of FIG. 2, no replacement of the targets 17 is carried out. Although it is not shown, it is preferable to hermetically seal each outlet with a temporary lid quickly after removing the targets 17 and the cathodes 18 to store the vacuum chamber 11 in a vacuum state during maintenance by evacuating the vacuum chamber 11. This is due to avoid contamination and materials that are difficult to evacuate (particularly, moisture) from adhering inside the vacuum chamber 11.

Figure 3:
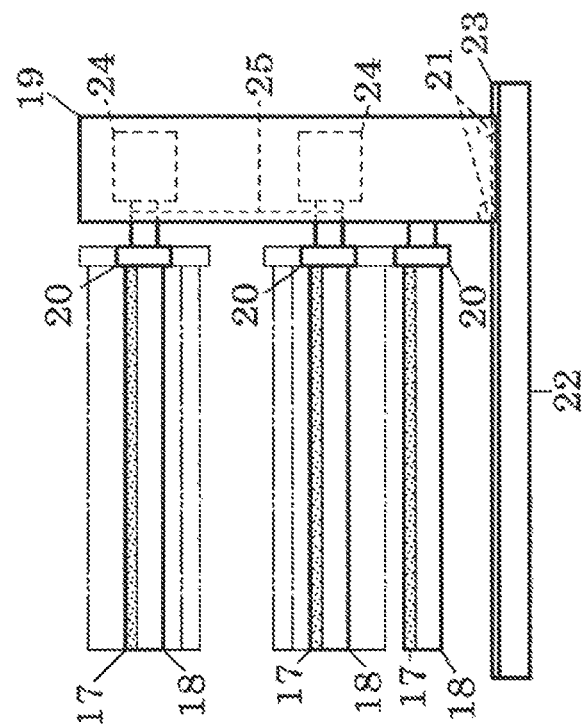
FIG. 3 shows a front view and a side view of a maintenance apparatus of targets and cathodes of a sputtering device of the present invention (at the time of rotation of targets and cathodes)
Figure 3:
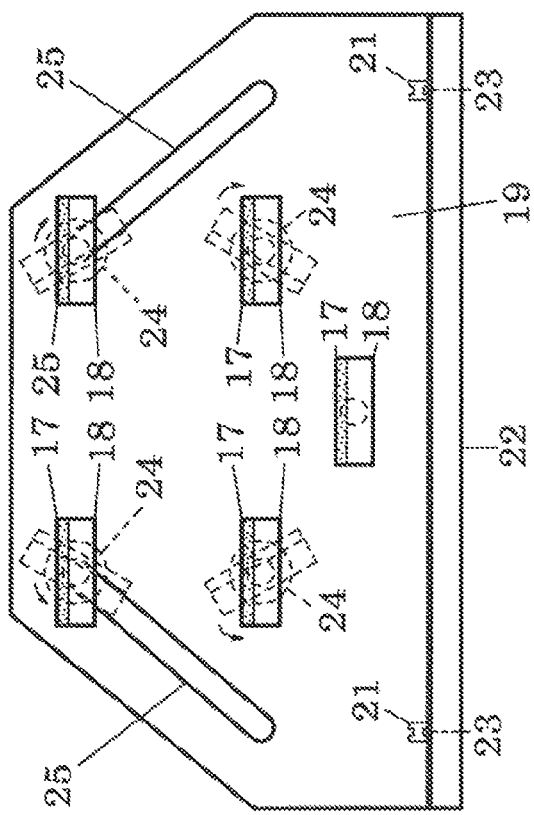

FIG. 3 shows a front view and a side view at the time when the cathode rotating apparatuses 24 are caused to operate to rotate the targets 17 and the cathodes 18 so as to make all of the targets face upwards as a second stage of maintenance of the targets 17 and the cathodes 18. At this time, rotation angles are measured by an angular sensor to be stored. The stored rotation angles are needed when returning the rotation angle of each of the targets 17 and the cathodes 18 to an original angle. Since all of the targets 17 are already facing upwards at the stage of FIG. 3, the targets 17 do not fall from the cathodes 18 even when screws are removed. In the case of the targets 17 and the cathodes 18 located in places at high height (upper two targets 17 and two cathodes 18 shown in FIG. 3), however, the workers are not able to work without mounting a stepladder. It is not efficient to replace the targets 17 located in places at high height and clean the cathodes 18, in addition, which is dangerous. As a result, in the stage of FIG. 3, it is preferable not to carry out maintenance work yet.

FIG. 4 shows a front view and a side view at the time when the cathodes sliding apparatuses 25 are caused to operate to move a plurality of targets 17 and a plurality of cathodes 18 located in places at high height downward to be almost the same height as targets 17 and cathodes 18 located in places at low height as a third stage of maintenance of the targets 17 and the cathodes 18. At this time, a travel distance is measured to be stored. The stored travel distance is needed when the targets 17 and the cathodes 18 return to the original height. It is also possible to move the targets 17 and the cathodes 18 located in places at high height to places at low height by operating a plurality of cathode rotating apparatuses 24 and a plurality of cathode sliding apparatuses 25 at the same time while changing the direction of each of the targets 17 and the cathodes 18 located in a place at high height to an upward direction. This makes it possible to save more time than performing a rotation and a movement in series. It is possible to save time by simultaneously performing rotation and movement when returning the direction and the height of the targets 17 and the cathodes 18 to the original state. In addition, all of the targets may face upwards by operating the cathode rotating apparatuses 24 to rotate the targets 17 and the cathodes 18 after operating the cathode sliding apparatuses 25 to move the targets 17 and the cathodes 18 located in places at high height to lower locations.

Actual maintenance of the targets 17 and the cathodes 18 is performed at the stage of FIG. 4. First, screws that attach the targets 17 to the cathodes 18 are removed. Since the targets 17 are facing upwards, the targets 17 do not fall even after the removal of the screws. As a result, there is no need to attach a fall prevention jig for the targets 17. Next, old targets 17 are removed. Since the targets 17 are heavy, a crane or a lift is used. There is a large work area around the targets 17 and the cathodes 18, resulting in easy use of a crane and a lift and a slight risk. Next, cleaning of the cathodes 18 is carried out. The cathodes 18 are arranged planarly and therefore, there is a low possibility of waste produced when cleaning the cathodes 18 being attached to the other cathodes 18. Next, a plurality of new targets 17 are placed on the cathodes 18 to be screwed down. At this time, it is not needed to attach a fall prevention jig because the targets are facing upwards, resulting in high efficiency in screwing. Actual maintenance of the targets 17 and the cathodes 18 are completed now. As shown in FIG. 4, there is a large work area around each target 17 and each cathode 18, which makes it possible to perform maintenance of all targets 17 and cathodes 18 all at once by a number of workers. As shown in FIG. 4, in the case of five targets 17 and five cathodes 18, when a plural number of works carry out maintenance at the same time, maintenance time is reduced to about one tenth as short as conventional maintenance methods for carrying out maintenance for each target 17 and each cathode 18 by one worker.

On the completion of actual maintenance of the targets 17 and the cathodes 18, the targets 17 and the cathodes 18 that have been moved from the places at high height to the places at low height are moved to the original height by operating the cathode sliding apparatuses 25. A travel distance is measured by a distance sensor to adjust the value previously stored to accurately return to the original height. As a result, the position of the targets 17 and the cathodes 18 becomes the position indicated in FIG. 3.

Next, the targets 17 and the cathodes 18 that have been rotated upwards for maintenance are rotated by operating the cathode rotating apparatuses 24 to return to the original rotation angles. At this time, rotation angles are measured by an angular sensor to accurately return to the original rotation angles. As a result, the rotation angles of the targets 17 and the cathodes 18 become the rotation angles shown in FIG. 2.

Finally, the vacuum chamber 11 is caused to be one atmospheric pressure to remove temporary lids. And the cathode carriages 19 is moved in a direction opposite to the direction when taking out the targets 17 and the cathodes 18 to put the targets 17 and the cathodes 18 back into the vacuum chamber 11. An outlet of each of the targets 17 and the cathodes 18 is hermetically sealed by a sealed lid 20. As a result, the position of each of the targets 17 and the cathodes 18 becomes the position shown in FIG. 1. This enables sputtering after vacuum drawing.

INDUSTRIAL APPLICABILITY

The sputtering device of the present invention includes a plurality of targets and a plurality of cathodes and is used for purposes for forming various kinds of thin layers on a surface of a long film substrate. The sputtering device of the present invention is easy for maintenance of the targets and the cathodes. The maintenance method for a sputtering device of the present invention is capable of increasing operating efficiency of the sputtering device because of short maintenance time of the targets and the cathodes.

What is claimed is:

1. A sputtering device, comprising:
   a vacuum chamber;
   a layer forming roll included in the vacuum chamber;
   a plurality of targets opposing to the layer forming roll;
   a plurality of cathodes for supporting the plurality of targets;
   a cathode carriage for supporting the plurality of targets and the plurality of cathodes;
   a plurality of cathode rotating apparatuses provided on the cathode carriage, the plurality of cathode rotating apparatuses being configured to rotationally support the targets and the cathodes by use of a longitudinal direction of each of the targets as a rotational axis;
   a plurality of cathode sliding apparatuses provided on the cathode carriage, the plurality of cathode sliding apparatuses being configured to support the plurality of cathode rotating apparatuses so as to change height of the cathode rotating apparatuses; and
   guiding parts for movably supporting and guiding the cathode carriage.

2. The sputtering device according to claim 1, wherein the cathode rotating apparatuses each include an angular sensor.

3. The sputtering device according to claim 1, wherein the cathode sliding apparatuses each include a distance sensor.

4. A maintenance method for a sputtering device, comprising the steps of:
   moving a cathode carriage to take a plurality of targets and a plurality of cathodes supported by the cathode carriage out of a vacuum chamber;
   operating a plurality of cathode rotating apparatuses to rotate the plurality of targets and the plurality of cathodes so as to cause the targets to face upwards;
   operating a plurality of cathode sliding apparatuses to move the targets and the cathodes located in places at high height to places at low height that are lower than said places at high height;
   removing the targets from the cathodes to attach a plurality of new targets that are different from the targets to the cathodes;
   operating the plurality of cathode sliding apparatuses to move the plurality of new targets and the cathodes to return to an original height thereof;
   operating the plurality of cathode rotating apparatuses to rotate the new targets and the cathodes so as to return to original rotation angles; and
   moving the cathode carriage in an opposite direction to put the new targets and the cathodes supported on the cathode carriage back into the vacuum chamber.

5. The sputtering device according to claim 2, wherein the cathode sliding apparatuses each include a distance sensor.

* * * * *